(12) United States Patent
Gaurav et al.

(10) Patent No.: US 7,620,645 B2
(45) Date of Patent: Nov. 17, 2009

(54) SCALABLE ALGORITHM FOR SHARING EDI SCHEMAS

(75) Inventors: Suraj Gaurav, Issaquah, WA (US); Surendra Machiraju, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 224 days.

(21) Appl. No.: 11/362,045

(22) Filed: Feb. 24, 2006

(65) Prior Publication Data

US 2007/0203921 A1    Aug. 30, 2007

(51) Int. Cl.
*G06F 17/00* (2006.01)
*G06F 15/173* (2006.01)
*G06F 15/177* (2006.01)

(52) U.S. Cl. .................. 707/101; 709/238; 709/221

(58) Field of Classification Search .................. 707/100, 707/101; 709/221, 238
See application file for complete search history.

(56) References Cited

U.S. PATENT DOCUMENTS

| | | | |
|---|---|---|---|
| 4,729,096 A | 3/1988 | Larson | |
| 4,787,035 A | 11/1988 | Bourne | |
| 4,860,203 A | 8/1989 | Corrigan et al. | |
| 4,951,196 A | 8/1990 | Jackson | |
| 5,202,977 A | 4/1993 | Pasetes, Jr. et al. | |
| 5,878,419 A | 3/1999 | Carter | |
| 5,897,645 A * | 4/1999 | Watters ...................... | 715/210 |
| 5,915,259 A | 6/1999 | Murata | |
| 6,101,556 A | 8/2000 | Piskiel et al. | |
| 6,256,667 B1 | 7/2001 | Wahlander et al. | |
| 6,302,326 B1 | 10/2001 | Symonds et al. | |
| 6,377,953 B1 | 4/2002 | Gawlick et al. | |
| 6,418,400 B1 | 7/2002 | Webber | |
| 6,442,569 B1 | 8/2002 | Crapo et al. | |
| 6,591,260 B1 | 7/2003 | Schwarzhoff et al. | |
| 6,609,200 B2 | 8/2003 | Anderson et al. | |
| 6,687,873 B1 | 2/2004 | Ballantyne et al. | |
| 6,735,598 B1 | 5/2004 | Srivastava | |
| 6,772,180 B1 | 8/2004 | Li et al. | |
| 6,785,689 B1 | 8/2004 | Daniel et al. | |

(Continued)

FOREIGN PATENT DOCUMENTS

KR    1020020054248 A    6/2002

(Continued)

OTHER PUBLICATIONS

Unknown, "4.0 Emerging Industry Frameworks/Repositories," http://www.dcnicn.com/XMLEDICentral/CDRL/HTML/Drafttask3delArpt/Drafttask3delArpt-05.htm, printed on Jan. 2, 2006, 48 pages, USA.

(Continued)

*Primary Examiner*—Shahid A Alam
*Assistant Examiner*—Joshua Bullock
(74) *Attorney, Agent, or Firm*—Senniger Powers LLP

(57) ABSTRACT

Developing a file corresponding to an electronic data interchange (EDI) schema. The EDI schema is selected for transmission to a destination device. A plurality of syntax structures in the selected EDI schema is identified. The plurality of syntax structures defines a type of transaction associated with the EDI schema. A plurality of EDI data values is extracted from the identified plurality of syntax structures according to the defined type. A file is generated corresponding to the type and including the extracted data values in the generated file such that the EDI schema can be re-created from the generated file.

20 Claims, 7 Drawing Sheets

U.S. PATENT DOCUMENTS

| | | | |
|---|---|---|---|
| 7,051,072 | B2 | 5/2006 | Stewart et al. |
| 7,069,501 | B2* | 6/2006 | Kunitake et al. ............ 715/234 |
| 7,249,157 | B2 | 7/2007 | Stewart et al. |
| 7,281,211 | B2 | 10/2007 | Jeannette et al. |
| 2001/0018697 | A1 | 8/2001 | Kunitake et al. |
| 2001/0049743 | A1 | 12/2001 | Phippen et al. |
| 2001/0056504 | A1 | 12/2001 | Kuznetsov |
| 2002/0042757 | A1 | 4/2002 | Albazz et al. |
| 2002/0049790 | A1* | 4/2002 | Ricker et al. ................ 707/513 |
| 2002/0083099 | A1 | 6/2002 | Knauss et al. |
| 2002/0103715 | A1 | 8/2002 | Bennett et al. |
| 2002/0111964 | A1 | 8/2002 | Chen et al. |
| 2002/0152175 | A1 | 10/2002 | Armstrong et al. |
| 2002/0178103 | A1 | 11/2002 | Dan et al. |
| 2003/0018666 | A1 | 1/2003 | Chen et al. |
| 2003/0101184 | A1 | 5/2003 | Chiu et al. |
| 2003/0121001 | A1* | 6/2003 | Jeannette et al. ............ 715/513 |
| 2003/0130845 | A1 | 7/2003 | Poplawski |
| 2003/0140048 | A1* | 7/2003 | Meier et al. ................... 707/10 |
| 2003/0149934 | A1 | 8/2003 | Worden |
| 2003/0154404 | A1 | 8/2003 | Beadles et al. |
| 2003/0158854 | A1* | 8/2003 | Yoshida et al. .............. 707/101 |
| 2003/0167446 | A1 | 9/2003 | Thomas |
| 2003/0182452 | A1* | 9/2003 | Upton ........................ 709/246 |
| 2003/0233420 | A1 | 12/2003 | Stark et al. |
| 2004/0010753 | A1* | 1/2004 | Salter et al. ................. 715/513 |
| 2004/0107213 | A1* | 6/2004 | Zubeldia et al. .......... 707/104.1 |
| 2004/0153968 | A1 | 8/2004 | Ching et al. |
| 2004/0177094 | A1 | 9/2004 | Jacobs et al. |
| 2004/0193435 | A1 | 9/2004 | Fang |
| 2004/0205592 | A1 | 10/2004 | Huang |
| 2005/0004885 | A1 | 1/2005 | Pandian et al. |
| 2005/0038816 | A1 | 2/2005 | Easton |
| 2005/0055631 | A1 | 3/2005 | Scardina et al. |
| 2005/0060317 | A1 | 3/2005 | Lott et al. |
| 2005/0063387 | A1 | 3/2005 | Chen et al. |
| 2005/0071344 | A1 | 3/2005 | Chen et al. |
| 2005/0114405 | A1 | 5/2005 | Lo |
| 2005/0131933 | A1 | 6/2005 | Jha |
| 2005/0132276 | A1 | 6/2005 | Panditharadhya et al. |
| 2005/0138648 | A1 | 6/2005 | Ahmed et al. |
| 2005/0150944 | A1 | 7/2005 | Melick et al. |
| 2005/0187973 | A1 | 8/2005 | Brychell, III et al. |
| 2005/0246415 | A1 | 11/2005 | Belfiore et al. |
| 2005/0256892 | A1 | 11/2005 | Harken |
| 2005/0256965 | A1 | 11/2005 | Hohmann et al. |
| 2005/0262130 | A1 | 11/2005 | Mohan |
| 2005/0278345 | A1* | 12/2005 | Andra et al. ................ 707/100 |
| 2006/0036522 | A1 | 2/2006 | Perham |
| 2007/0005786 | A1 | 1/2007 | Kumar et al. |
| 2007/0022375 | A1 | 1/2007 | Walker |
| 2007/0112579 | A1 | 5/2007 | Ratnakaran et al. |
| 2007/0145138 | A1 | 6/2007 | Snyder et al. |
| 2007/0220051 | A1 | 9/2007 | Brentano et al. |

FOREIGN PATENT DOCUMENTS

| | | |
|---|---|---|
| WO | WO 01/33369 A1 | 5/2001 |
| WO | WO 01/55895 A2 | 8/2001 |
| WO | WO 03/021901 A2 | 3/2003 |

OTHER PUBLICATIONS

Unknown, "Content Management Technology/Industry News, The Gilbane Report," http://gilbane.com/content_management_news.pl/2000/11/content_management/news.html, Nov. 29, 2000, 30 pages, Bluebill Advisors, Inc.

Kuramitsu Kimio et al, "Distributed Object-Oriented Schema to Share XML-based Catalogs among Business," Proceedings of the first International Conference on Web Information Systems Engineering, pp. 81-90, Jun. 2000, also available at http://xml.coverpages.org/kiki-wise2000.html, 16 pages, IEEE Press, USA.

Liu, Youzhong et al, "A Rule Warehouse System for Knowledge Sharing and Business Collaboration," UF CISE TR01-006A, http://www.cise.ufl.edu/tech_reports/tr01/tr01-006.pdf, 2001, 67 pages, Database Systems R&D Center, University of Florida, FL.

Hinkelman, Scott, "Business Integration—Information Conformance Statements (BI-ICS)—An XML specification for declaring business information conformance," http://www.128.ibm.com/developerworks/xml/library/x-biics/, updated on Oct. 12, 2005, 4 pages, IBM, USA.

Unknown, "iWay Software 5.5: New Enhancements," http://www.iwaysoftware.com/products/iWay55 features.html, printed on Dec. 27, 2005, 3 pages, iWay Software, USA.

Unknown, "CAM: Content Assembly Mechanism—business transaction information management," http://www.oasis-open.org/committees/download.php/5929/CAM%20Technical%20brochure%2003Mar04.pdf, printed on Feb. 23, 2006, 7 pages, Oasis, USA.

Unknown, "EDI Tools," Stylus Studio, http://www.stylusstudio.com/edi/, printed on Jan. 2, 2006, 3 pages, Progress Software Corporation, USA.

Unknown, "OBOE—Open Business Objects for EDI An EDI and XML Software Developer's Toolkit," http://www.americancoders.com/OpenBusinessObjects/overview.html, updated on Oct. 31, 2005, 5 pages, Version 3.3.4, American Coders, Ltd., USA.

Unknown, "XML GUI Mapper with EDI Authoring Tools," http://www.redix.com/dtd13.htm, printed on Jan. 2, 2006, 4 pages, Redix International, Inc., USA.

Van De Putte, Geert, et al, "Implementing EDI Solution," Oct. 2003, IBM Redbook, 244 pages.

Adams et al., "BizTalk Unleashed", Feb. 8, 2002, Sams, 54 selected pages.

"HIPAA Transaction Sets and Code Sets (HTSCS) 270 / 271 Companion Guide Specifications", Mar. 30, 2004, South Carolina Department of Health and Human Services, Version 1.1, [internet] http://www.scdhhshipaa.org, 38 pages.

* cited by examiner

FIG. 3B

```
                                                            ┌─ 304
SACLOOP1(0) MIN=0 MAX=25
        SAC 0 1
  306─┘      SAC01 1 1 {ID -1 -1 VALUES()}
             SAC02 0 1 {ID -1 -1 VALUES()}
             SAC03 0 1 {ID -1 -1 VALUES()}
             SAC04 0 1 {AN 1 10}
             SAC05 0 1 {N 2 -1 -1}
             SAC06 0 1 {ID -1 -1 VALUES()}
             SAC07 0 1 {R}
             SAC08 0 1 {R}
             SAC09 0 1 {ID -1 -1 VALUES()}
             SAC10 0 1 {R}
             SAC11 0 1 {R}
             SAC12 0 1 {ID -1 -1 VALUES()}
             SAC13 0 1 {AN 1 30}
             SAC14 0 1 {AN 1 20}
             SAC15 0 1 {AN 1 80}
             SAC16 0 1 {ID 2 3 VALUES()}
        CUR_2 0 1
  308─┘      CUR01 1 1 {ID -1 -1 VALUES()}
             CUR02 1 1 {ID 3 3 VALUES()}
             CUR03 0 1 {R}
             CUR04 0 1 {ID -1 -1 VALUES()}
             CUR05 0 1 {ID 3 3 VALUES()}
             CUR06 0 1 {ID -1 -1 VALUES()}
             CUR07 0 1 {ID -1 -1 VALUES()}
             CUR08 0 1 {DT 8 8}
             CUR09 0 1 {TM 6 8}
             CUR10 0 1 {ID -1 -1 VALUES()}
             CUR11 0 1 {DT 8 8}
             CUR12 0 1 {TM 6 8}
             CUR13 0 1 {ID -1 -1 VALUES()}
             CUR14 0 1 {DT 8 8}
             CUR15 0 1 {TM 6 8}
             CUR16 0 1 {ID -1 -1 VALUES()}
             CUR17 0 1 {DT 8 8}
             CUR18 0 1 {TM 6 8}
             CUR19 0 1 {ID -1 -1 VALUES()}
             CUR20 0 1 {DT 8 8}
             CUR21 0 1 {TM 6 8}
```

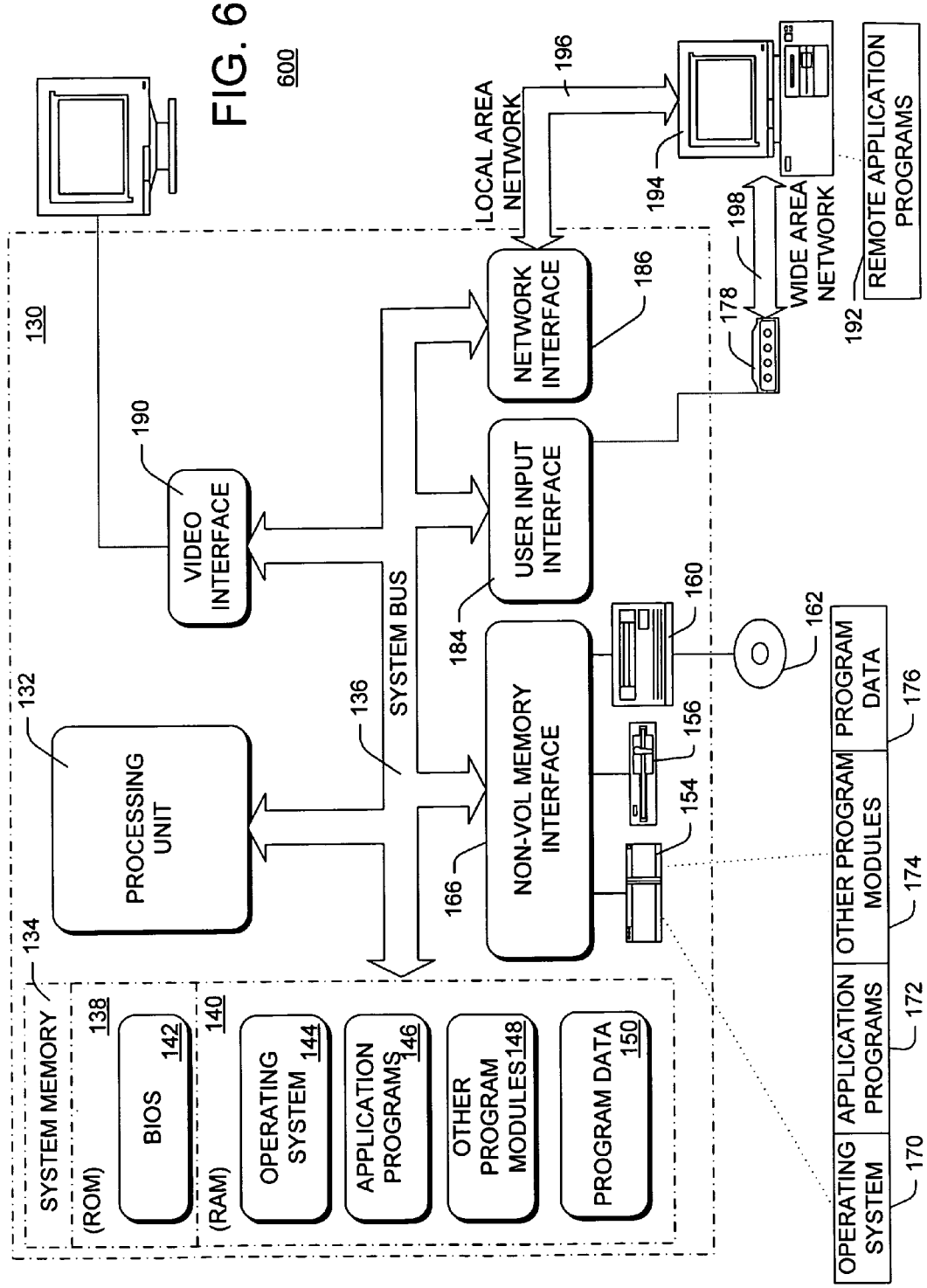

SCALABLE ALGORITHM FOR SHARING EDI SCHEMAS

BACKGROUND

Electronic data interchange (EDI) is one of the ways businesses use for exchanging computer-to-computer business information based on approved formatting standards and schemas. For example, millions of companies around the world transmit data associated with business transactions (e.g., purchase orders, shipping/air bills, invoices, or the like) using EDI to conduct commerce.

In a typical EDI transaction model, a large business entity or an EDI integration broker trades with numerous partners and has the technical capability to handle numerous EDI transaction data in various EDI formats and schemas. These entities, also known as "hubs," transact with one or more suppliers, also known as "spokes". Each of the spokes typically is a relatively small business entity that is only capable of dealing with one hub.

Before the spokes attempt to initiate transactions via EDI with the hub, the hub typically transmits various EDI schemas to the spokes so that the spokes may properly format the EDI transactions according to the EDI schemas. Currently, EDI schemas are large in size and the file size for each EDI schema typically ranges from 1 MB to 3 MB. In addition, the hub or large trading partners customarily transmit a large amount of schemas to the spokes, without taking into considerations of the spokes' lack of hardware capability. As such, thousands of such schemas, which may occupy several gigabytes in bandwidth during transmission, are transmitted from the hub to the spokes. This practice unduly burdens the spokes' ability to handle schemas efficiently when their data connection bandwidth is limited.

SUMMARY

Embodiments of the invention overcome the deficiencies of existing systems and practice by processing the schemas to enable trading partners to exchange schemas in bulk without placing transmission burdens on the spokes. Embodiments of the invention generate a simple text file embodying the information or data relating to the schemas while removing redundant and repeated information.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Other features will be in part apparent and in part pointed out hereinafter.

BRIEF DESCRIPTION OF THE DRAWINGS

FIG. 3B is a block diagram illustrating a second exemplary file developed from an EDI schema according to an embodiment of the invention.

FIG. 6 is a block diagram illustrating one example of a suitable computing system environment in which the invention may be implemented.

Corresponding reference characters indicate corresponding parts throughout the drawings.

DETAILED DESCRIPTION

Figure 1:
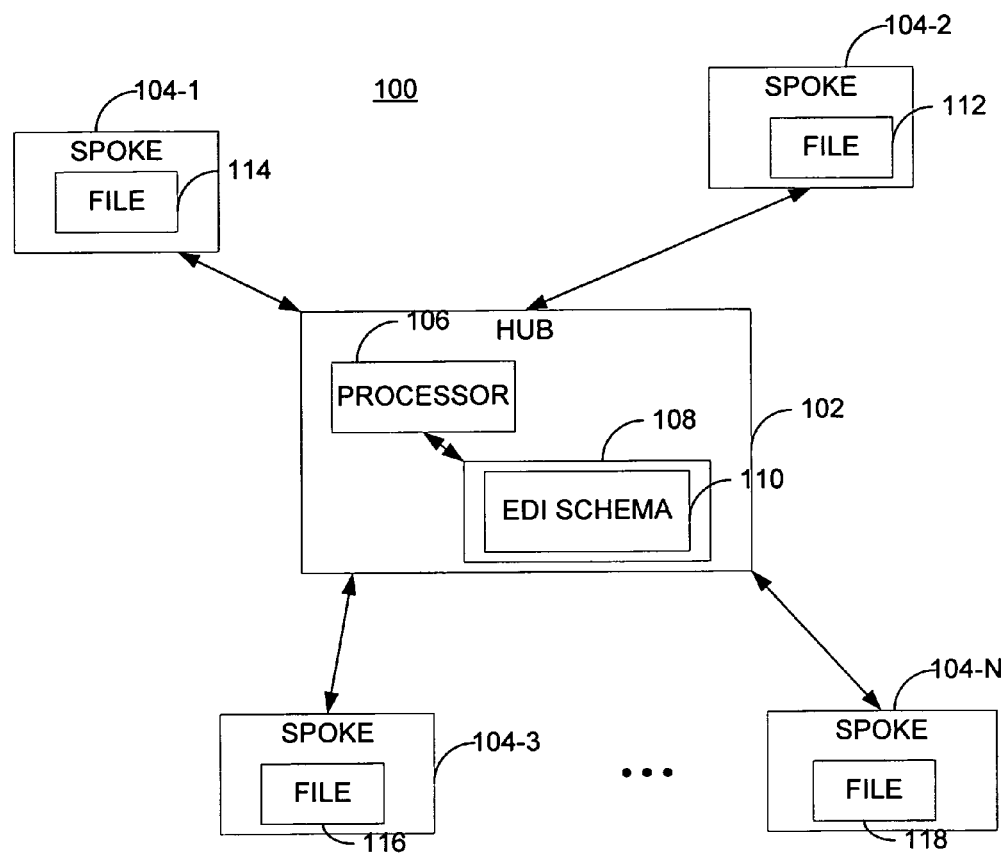
FIG. 1 is a block diagram illustrating a system for developing a file corresponding to an electronic data interchange (EDI) schema according to an embodiment of the invention.

Referring first to FIG. 1, a block diagram illustrates a system 100 for developing a file corresponding to an electronic data interchange (EDI) schema according to an embodiment of the invention. The system 100 includes a hub 102 linked to and communicating with one or more spokes 104. In one embodiment, the hub 102 includes a server computer or a computing device serving one or more processors (e.g., processor 106) or processing units for executing computer-executable instructions for serving the spokes 104. In one example, the spokes 104 include a computing device having one or more components included in or coupled with a computer 130, as shown in FIG. 6.

In one example, the hub 102 also includes a memory area 108 for storing one or more EDI schemas, such as an EDI schema 110. Initially, the hub 102 and the spokes 104 establish agreements as to the EDI formats or standards to be used for transmitting transaction data therebetween. Once the parties determine the particular EDI formats or standards, the hub 102 selects the appropriate EDI schemas to be transmitted to the spokes 104. In another example, the hub 102 may choose to select all EDI schemas for all types of transactions, such as purchase orders, bills of lading, invoices, payrolls, or the like, to the spokes 104. Although the communications between the hub 102 and the spokes 104 can be a private or public, either wired or wirelessly, communications network, the spokes 104 typically lack the hardware resources to handle large amount of EDI schemas sent from the hub 102. In addition, the type and bandwidth of computing network communications for the spokes 104 are not equipped to handle such demand imposed by the thousands of EDI schemas, which can reach several Gigabytes in data size. For example, the spokes may be connected to a public communications network such as the internet via a dial-up, a digital subscriber line (DSL), or a cable connection, which has a limited data transmission bandwidth.

As such, the processor 106 of the hub 102 develops a file (e.g., file 112, 114, 116, or 118) for the spokes such that the EDI schema 110 can be re-created from the file, and the file size of the file 112 is substantially smaller than the EDI schema 110.

Figure 2:
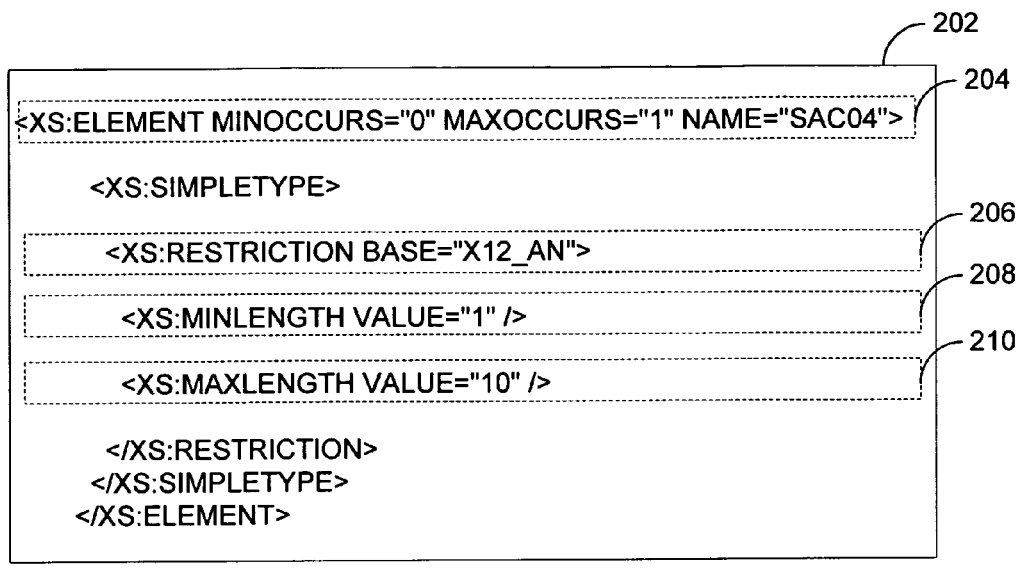
FIG. 2 is a block diagram illustrating an EDI schema to be compacted by the system in FIG. 1 according to an embodiment of the invention.

Referring now to FIG. 2, a block diagram illustrates an exemplary EDI schema 202 to be processed by the system 100 in FIG. 1 according to an embodiment of the invention. In this example, the EDI schema 202 is written in an eXtensible Markup Language (XML) format and includes one or more XML tags, which are self-describing, but are verbose and demand greater resource requirements in terms of disk space or memory for processing.

For example, a tag statement 204 indicates that there are three data elements: minimum occurrence, maximum occurrence, and name. As shown in FIG. 2, each data element includes a data value, such as "0", "1", and "SAC04", respectively.

In developing or generating the file 112, embodiments of the invention identify a plurality of syntax structures in the EDI schema 202. For the example, the processor 106 of the hub 102 executes computer-executable instructions for identifying the plurality of syntax structures, such as <XS: element>, <XS: restriction base>, <XS: minlength>, or other XML tags defining a type of transaction associated with the EDI schema 202. In one example, the XML tags may define a purchase order transaction schema while other XML tags may appropriately identify EDI schemas of other transaction type, (e.g., invoice, payroll, or the like).

Still referring to FIG. 2, once the plurality of syntax structure is identified, a plurality of EDI data values is extracted from the identified plurality of syntax structures according to the defined type. Once the plurality of the EDI data values is extracted, embodiments of the invention generate a file corresponding to the type and include the extracted data values in the generated file such that the EDI schema can be re-created from the generated file. For example, the processor 106 of the hub 102 extracts a data value "AN" from a XML tag statement 206 after identifying the syntax structure of "<XS: Restriction base>". Likewise, a XML tag statement 208 reveals that "1" is the data value to be extracted. Similarly, the processor 106 of the hub 102 may also extract a data value "10" from an XML tag statement 210 after identifying the syntax structure of "<XS: Maxlength>".

It is to be understood that embodiments of the invention may appropriately identify EDI scripting languages or programming languages other than XML, such as HTML or XSLT, in identify the syntax structures of the languages without departing from the scope of the invention.

Figure 3A:
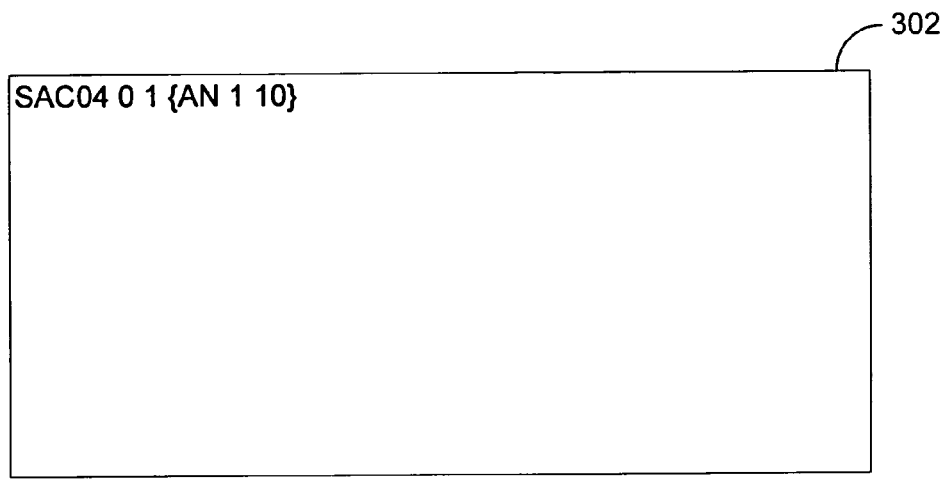
FIG. 3A is a block diagram illustrating a first exemplary file developed from the EDI schema in FIG. 2 according to an embodiment of the invention.

Referring now to FIG. 3A, a block diagram illustrates a first exemplary file 302 developed from the EDI schema in FIG. 2 according to an embodiment of the invention. In this example, the file 302 includes the following extracted data values to represent the EDI schema 202: "SAC04 0 1 {AN 1 10}". In one embodiment, the extracted data value in the file 302 is organized according to an encoding rule. In one example, the encoding rule defines or formats the extracted data values by placing data values in the following order: "name" "minimum occurrence" "maximum occurrence" "restriction base" "minlength" "maxlength." It is to be understood that other sequencing order of extracted data values or formatting styles (e.g., delimiter characters, indentation, carriage return symbols, or the like) may be employed without departing from the scope of the invention.

As shown in FIGS. 2 and 3A, the content of the EDI schema 202 includes about 273 characters (excluding the spaces), while the developed or generated file 302 includes only 19 characters, including the spaces. Both EDI schema 202 and the developed file 302 represent the essential information which defines and describes a format of a transaction type for the spokes. With such a reduced simplicity and data size, embodiments of the invention ease the burden on the spokes to handle numerous EDI schemas transmission. FIG. 3B illustrates another example of a second exemplary file 304 representing an EDI schema having a SACLoop.

In the example illustrated in FIG. 3B, the exemplary file 304 includes a compacted SACLoop. The SACLoop is a loop structure and includes other children structure. In this example, the SACLoop includes two children: SAC 306 and CUR 308. In one embodiment, each line representing a child is indented in the file 304 for readability. In addition, each child may also include one or more children. As such, both children SAC 306 and CUR 308 and their respective children (e.g., SAC01 to SAC16, and CUR01 to CUR21) are compacted according to the method illustrated above.

In another embodiment, the size of the developed or generated file 302 may be further reduced in size by using any generic data compression algorithm or known compression technique (e.g., zip, tar, rar, or the like) to further compact the size of the file 302.

Figure 4:
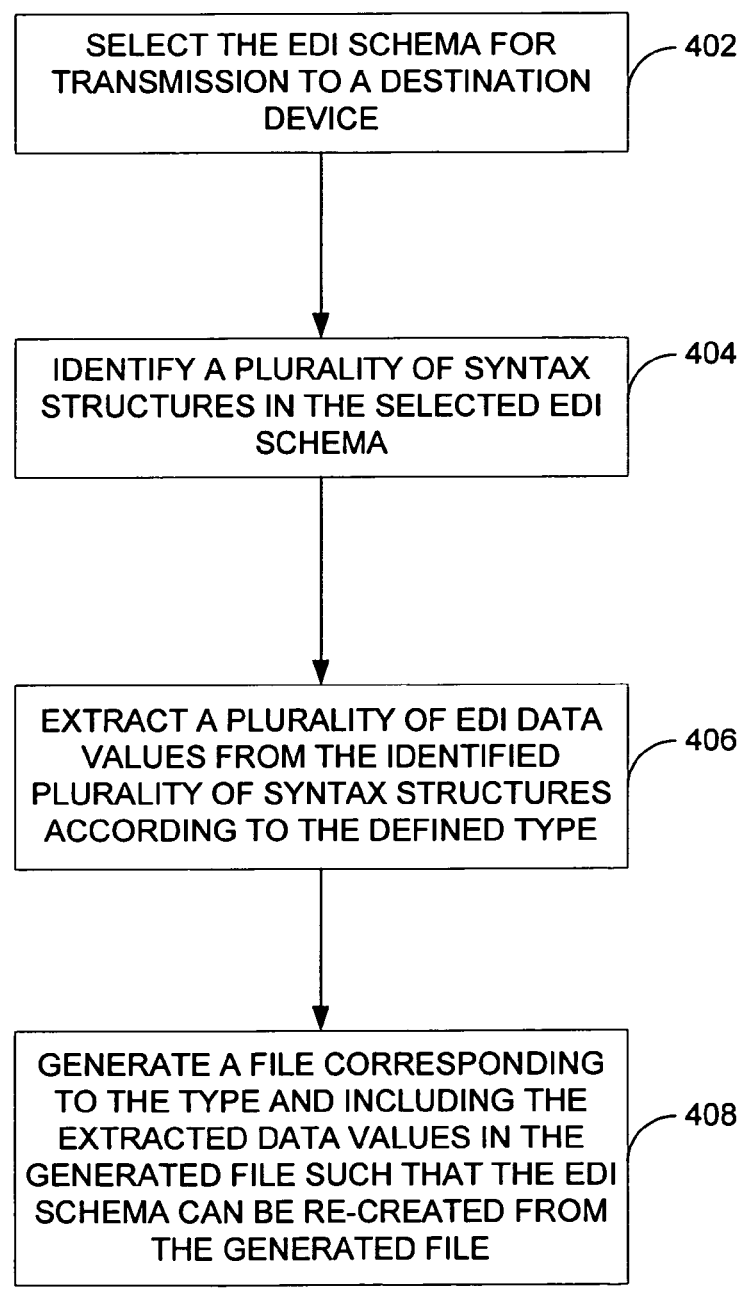
FIG. 4 is a flow diagram illustrating an exemplary method for developing a file according to an EDI schema according to an embodiment of the invention.
Figure 5:
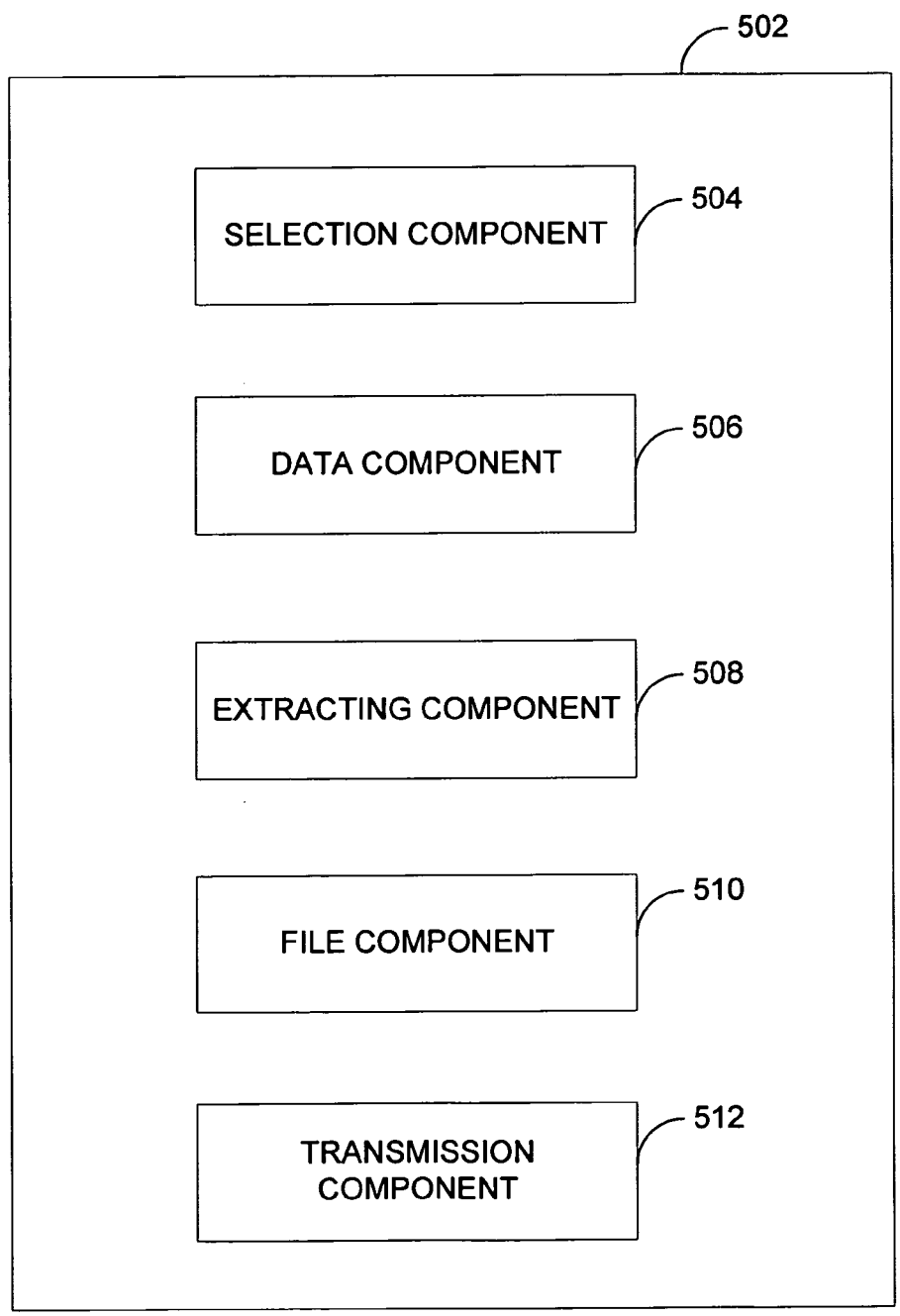
FIG. 5 is a block diagram illustrating an exemplary computer-readable medium on which aspects of the invention may be stored.

FIG. 4 is a flow diagram illustrating an exemplary method for developing a file according to an EDI schema according to an embodiment of the invention. In one example, one or more computer-readable media, such as a computer-readable medium 502 in FIG. 5, includes computer-executable components to implement the method illustrated in FIG. 4.

For example, a selection component 504 selects an EDI schema for transmission to a destination device, such as a spoke 104-1 at 402. A data component 506 identifies a plurality of syntax structures in the selected EDI schema at 404. At 406, an extracting component 506 extracts a plurality of EDI data values from the identified plurality of syntax structures according to the defined type. A file component 508 generates a file, such as file 302, corresponding to the type and including the extracted data values in the generated file such that the EDI schema can be re-created from the generated file. In another embodiment, a transmission component 510 transmits the generated or developed file from a source (e.g., the hub 102) to the destination device (e.g., the spokes 104).

In operation, embodiments of the invention may be implemented in the following manner. A hub, such as a large business entity which operates a number of computing equipment that is capable of processing thousands of EDI documents or transactions, selects one or more the EDI schema for transmission to a destination device, such as a spoke. Instead of transmitting the schemas in its original format, the hub identifies a plurality of syntax structures in the selected EDI schema. The plurality of syntax structures defines a type of transaction associated with the EDI schema. For example, the hub may select a purchase order type of schema.

The hub next extracts a plurality of EDI data values from the identified plurality of syntax structures according to the defined type. For example, for a purchase order type of EDI transaction, one or more particular data values are extracted according to the purchase order type. Upon extracting, the hub generates a file corresponding to the type and includes the extracted data values in the generated file such that the EDI schema can be re-created from the generated file.

FIG. 6 shows one example of a general purpose computing device in the form of a computer 130. In one embodiment of the invention, a computer such as the computer 130 is suitable for use in the other figures illustrated and described herein. Computer 130 has one or more processors or processing units 132 and a system memory 134. In the illustrated embodiment, a system bus 136 couples various system components including the system memory 134 to the processors 132. The bus 136 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

The computer 130 typically has at least some form of computer readable media. Computer readable media, which include both volatile and nonvolatile media, removable and non-removable media, may be any available medium that may be accessed by computer 130. By way of example and not limitation, computer readable media comprise computer storage media and communication media. Computer storage media include volatile and nonvolatile, removable and non-removable media implemented in any method or technology for storage of information such as computer readable instructions, data structures, program modules or other data. For example, computer storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that may be used to store the desired information and that may be accessed by computer 130. Communication media typically embody computer readable instructions, data structures, program modules, or other data in a modulated data signal such as a carrier wave or other transport mechanism and include any information delivery media. Those skilled in the art are familiar with the modulated data signal, which has one or more of its characteristics set or changed in such a manner as to encode information in the signal. Wired media, such as a wired network or direct-wired connection, and wireless media, such as acoustic, RF, infrared, and other wireless media, are examples of communication media. Combinations of any of the above are also included within the scope of computer readable media.

The system memory 134 includes computer storage media in the form of removable and/or non-removable, volatile and/or nonvolatile memory. In the illustrated embodiment, system memory 134 includes read only memory (ROM) 138 and random access memory (RAM) 140. A basic input/output system 142 (BIOS), containing the basic routines that help to transfer information between elements within computer 130, such as during start-up, is typically stored in ROM 138. RAM 140 typically contains data and/or program modules that are immediately accessible to and/or presently being operated on by processing unit 132. By way of example, and not limitation, FIG. 6 illustrates operating system 144, application programs 146, other program modules 148, and program data 150.

The computer 130 may also include other removable/non-removable, volatile/nonvolatile computer storage media. For example, FIG. 6 illustrates a hard disk drive 154 that reads from or writes to non-removable, nonvolatile magnetic media. FIG. 6 also shows a magnetic disk drive 156 that reads from or writes to a removable, nonvolatile magnetic disk 158, and an optical disk drive 160 that reads from or writes to a removable, nonvolatile optical disk 162 such as a CD-ROM or other optical media. Other removable/non-removable, volatile/nonvolatile computer storage media that may be used in the exemplary operating environment include, but are not limited to, magnetic tape cassettes, flash memory cards, digital versatile disks, digital video tape, solid state RAM, solid state ROM, and the like. The hard disk drive 154, and magnetic disk drive 156 and optical disk drive 160 are typically connected to the system bus 136 by a non-volatile memory interface, such as interface 166.

The drives or other mass storage devices and their associated computer storage media discussed above and illustrated in FIG. 6, provide storage of computer readable instructions, data structures, program modules and other data for the computer 130. In FIG. 6, for example, hard disk drive 154 is illustrated as storing operating system 170, application programs 172, other program modules 174, and program data 176. Note that these components may either be the same as or different from operating system 144, application programs 146, other program modules 148, and program data 150. Operating system 170, application programs 172, other program modules 174, and program data 176 are given different numbers here to illustrate that, at a minimum, they are different copies.

The computer 130 may operate in a networked environment using logical connections to one or more remote computers, such as a remote computer 194. The remote computer 194 may be a personal computer, a server, a router, a network PC, a peer device or other common network node, and typically includes many or all of the elements described above relative to computer 130. The logical connections depicted in FIG. 6 include a local area network (LAN) 196 and a wide area network (WAN) 198, but may also include other networks. LAN 136 and/or WAN 138 may be a wired network, a wireless network, a combination thereof, and so on. Such networking environments are commonplace in offices, enterprise-wide computer networks, intranets, and global computer networks (e.g., the Internet).

When used in a local area networking environment, computer 130 is connected to the LAN 196 through a network interface or adapter 186. When used in a wide area networking environment, computer 130 typically includes a modem 178 or other means for establishing communications over the WAN 198, such as the Internet. The modem 178, which may be internal or external, is connected to system bus 136 via the user input interface 184, or other appropriate mechanism. In a networked environment, program modules depicted relative to computer 130, or portions thereof, may be stored in a remote memory storage device (not shown). By way of example, and not limitation, FIG. 6 illustrates remote application programs 192 as residing on the memory device. The network connections shown are exemplary and other means of establishing a communications link between the computers may be used.

Generally, the data processors of computer 130 are programmed by means of instructions stored at different times in the various computer-readable storage media of the computer. Programs and operating systems are typically distributed, for example, on floppy disks or CD-ROMs. From there, they are installed or loaded into the secondary memory of a computer. At execution, they are loaded at least partially into the computer's primary electronic memory. Aspects of the invention described herein includes these and other various types of computer-readable storage media when such media contain instructions or programs for implementing the steps described below in conjunction with a microprocessor or other data processor. Further, aspects of the invention include the computer itself when programmed according to the methods and techniques described herein.

For purposes of illustration, programs and other executable program components, such as the operating system, are illustrated herein as discrete blocks. It is recognized, however, that such programs and components reside at various times in different storage components of the computer, and are executed by the data processor(s) of the computer.

Although described in connection with an exemplary computing system environment, including computer 130, embodiments of the invention are operational with numerous other general purpose or special purpose computing system environments or configurations. The computing system environment is not intended to suggest any limitation as to the scope of use or functionality of any aspect of the invention. Moreover, the computing system environment should not be interpreted as having any dependency or requirement relating to any one or combination of components illustrated in the exemplary operating environment. Examples of well known computing systems, environments, and/or configurations that may be suitable for use with aspects of the invention include, but are not limited to, personal computers, server computers, hand-held or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the invention may be described in the general context of computer-executable instructions, such as program modules, executed by one or more computers or other devices. Generally, program modules include, but are not limited to, routines, programs, objects, components, and data structures that perform particular tasks or implement particular abstract data types. Aspects of the invention may also be practiced in distributed computing environments where tasks are performed by remote processing devices that are linked through a communications network. In a distributed computing environment, program modules may be located in both local and remote computer storage media including memory storage devices.

An interface in the context of a software architecture includes a software module, component, code portion, or other sequence of computer-executable instructions. The interface includes, for example, a first module accessing a second module to perform computing tasks on behalf of the first module. The first and second modules include, in one example, application programming interfaces (APIs) such as provided by operating systems, component object model (COM) interfaces (e.g., for peer-to-peer application communication), and extensible markup language metadata interchange format (XMI) interfaces (e.g., for communication between web services).

The interface may be a tightly coupled, synchronous implementation such as in Java 2 Platform Enterprise Edition (J2EE), COM, or distributed COM (DCOM) examples. Alternatively or in addition, the interface may be a loosely coupled, asynchronous implementation such as in a web service (e.g., using the simple object access protocol). In general, the interface includes any combination of the following characteristics: tightly coupled, loosely coupled, synchronous, and asynchronous. Further, the interface may conform to a standard protocol, a proprietary protocol, or any combination of standard and proprietary protocols.

The interfaces described herein may all be part of a single interface or may be implemented as separate interfaces or any combination therein. The interfaces may execute locally or remotely to provide functionality. Further, the interfaces may include additional or less functionality than illustrated or described herein.

In operation, computer 130 executes computer-executable instructions such as those illustrated in the figures, such as FIG. 4, to implement aspects of the invention.

The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Embodiments of the invention may be implemented with computer-executable instructions. The computer-executable instructions may be organized into one or more computer-executable components or modules. Aspects of the invention may be implemented with any number and organization of such components or modules. For example, aspects of the invention are not limited to the specific computer-executable instructions or the specific components or modules illustrated in the figures and described herein. Other embodiments of the invention may include different computer-executable instructions or components having more or less functionality than illustrated and described herein.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

As various changes could be made in the above constructions, products, and methods without departing from the scope of aspects of the invention, it is intended that all matter contained in the above description and shown in the accompanying drawings shall be interpreted as illustrative and not in a limiting sense.

What is claimed is:

1. A method for developing a file corresponding to an electronic data interchange (EDI) schema, said method comprising:
   selecting the EDI schema for transmission to a destination device;
   identifying a plurality of syntax structures in the selected EDI schema, said plurality of syntax structures defining a type of transaction associated with the EDI schema, said plurality of syntax structures include structure elements and a plurality of EDI data values corresponding to each of the structure elements;
   extracting only the plurality of EDI data values from the structure elements of the identified plurality of syntax structures according to the defined type;
   generating a file corresponding to the type and including the extracted data values in the generated file such that the EDI schema can be re-created from the generated file, wherein said generated file has only the extracted data values without the identified plurality of syntax structures; and
   transmitting the generated file separately from the plurality of syntax structures of the transaction type associated with the EDI schema to a receiving computing device for combining the generated file and the plurality of syntax structures to re-create the EDI schema on the computing device.

2. The method of claim 1, wherein identifying the plurality of syntax structures comprises identifying the plurality of syntax structures of eXtensible Markup Language (XML) tags.

3. The method of claim 2, wherein identifying the plurality of syntax structures of XML tags includes identifying one or more of the following properties of the XML tags: name, minimum number of occurrences, and maximum number of occurrences.

4. The method of claim 1, wherein extracting comprises identifying data elements having one or more of the following properties: data type name, minimum length, and maximum length.

5. The method of claim 1, wherein generating the file comprises generating a text file, said text file having a file size substantially smaller than the data size of the EDI schema.

6. The method of claim 5, wherein the extracted data values in the text file are organized according to an encoding rule.

7. The method of claim 1, wherein one or more computer storage media have computer-executable instructions for performing the method of claim 1.

8. A system for generating a file based on an electronic data interchange (EDI) schema, said system comprising:

a memory area for storing the EDI schema; and a processor for executing computer-executable instructions for:

identifying a plurality of syntax structures in the stored EDI schema, said plurality of syntax structures defining a type of transaction associated with the EDI schema, said plurality of syntax structures include structure elements and a plurality of EDI data values corresponding to each of the structure elements;

extracting only the plurality of EDI data values from the structure elements of the identified plurality of syntax structures according to the defined type;

generating a file corresponding to the type and including the extracted data values in the generated file such that the EDI schema can be re-created from the generated file, wherein said generated file has only the extracted data values without the identified plurality of syntax structures; and transmitting the generated file separately from the identified plurality of syntax structures of the transaction type associated with the EDI schema to a receiving computing device for combining the generated file and the identified plurality of syntax structures to re-create the EDI schema on the computing device.

9. The system of claim 8, wherein the processor is configured to identify the plurality of syntax structures of eXtensible Markup Language (XML) tags.

10. The system of claim 9, wherein the processor is configured to identify one or more of the following properties of the XML tags: name, minimum number of occurrences, and maximum number of occurrences.

11. The system of claim 8, wherein the processor extracts the plurality of EDI data values by identifying data elements having one or more of the following properties: data type name, minimum length, and maximum length.

12. The system of claim 8, wherein the processor generates a text file, said text file having a file size substantially smaller than the data size of the EDI schema.

13. The system of claim 12, wherein the extracted data values in the text file are organized according to an encoding rule.

14. One or more computer storage media having computer-executable components for developing a file according to an electronic data interchange (EDI) schema, said computer-executable components comprising:

a selection component for selecting the EDI schema for transmission from a hub to a spoke;

a data component for identifying a plurality of syntax structures in the selected EDI schema, said plurality of syntax structures defining a type of transaction associated with the EDI schema, said plurality of syntax structures include structure elements and a plurality of EDI data values corresponding to each of the structure elements;

an extracting component for extracting only the plurality of EDI data values from the structure elements of the identified plurality of syntax structures according to the defined type; and a file component for generating a file corresponding to the type and including the extracted data values in the generated file such that the EDI schema can be re-created from the generated file, wherein said generated file has only the extracted data values without the identified plurality of syntax structures, wherein the generated file is transmitted separately from the plurality of syntax structures of the transaction type associated with the EDI schema to a receiving computing device for combining the generated file and the plurality of syntax structures to re-create the EDI schema on the computing device.

15. The computer storage media of claim 14, wherein the data component identifies the plurality of syntax structures of eXtensible Markup Language (XML) tags.

16. The computer storage media of claim 15, wherein the data component identifies one or more of the following properties of the XML tags: name, minimum number of occurrences, and maximum number of occurrences.

17. The computer storage media of claim 14, wherein the extracting component extracts the plurality of EDI data values by identifying data elements having one or more of the following properties: data type name, minimum length, and maximum length.

18. The computer storage media of claim 14, wherein the file component generates a text file, said text file having a file size substantially smaller than the data size of the EDI schema.

19. The computer storage media of claim 18, wherein the extracted data values in the text file are organized according to an encoding rule.

20. The computer storage media of claim 14, further comprising a transmission component for transmitting the generated file from the hub to the spoke.

\* \* \* \* \*